(12) United States Patent
LiCausi et al.

(10) Patent No.: US 8,815,685 B2
(45) Date of Patent: Aug. 26, 2014

(54) METHODS FOR FABRICATING INTEGRATED CIRCUITS HAVING CONFINED EPITAXIAL GROWTH REGIONS

(71) Applicant: GLOBALFOUNDRIES, Inc., Grand Cayman (KY)

(72) Inventors: Nicholas LiCausi, Watervliet, NY (US); Jody Fronheiser, Delmar, NY (US); Errol Todd Ryan, Clifton Park, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/755,246

(22) Filed: Jan. 31, 2013

(65) Prior Publication Data

US 2014/0213037 A1      Jul. 31, 2014

(51) Int. Cl.
*H01L 21/336* (2006.01)
*H01L 21/762* (2006.01)

(52) U.S. Cl.
CPC .............................. *H01L 21/76224* (2013.01)
USPC ....................................................... 438/269

(58) Field of Classification Search
None
See application file for complete search history.

(56) References Cited

U.S. PATENT DOCUMENTS

2013/0140639 A1*   6/2013   Shieh et al. .................... 257/368
2013/0344677 A1*  12/2013   Doris et al. .................... 438/424

OTHER PUBLICATIONS

Hydrophobicity, Hydrophilicity and Silane Surface Modification; Gelest, Inc.; pp. 1-76, Oct. 2006.

* cited by examiner

*Primary Examiner* — Charles Garber
*Assistant Examiner* — Andre' C Stevenson
(74) *Attorney, Agent, or Firm* — Ingrassia Fisher & Lorenz, P.C.

(57) ABSTRACT

Methods are provided for fabricating integrated circuits. In accordance with one embodiment, the method includes forming a portion of a semiconductor substrate at least partially bounded by a confinement isolation material. A liner dielectric is formed overlying the confinement isolation material and is treated to passivate a surface thereof. An epitaxial layer of semiconductor material is then grown overlying the portion of semiconductor substrate.

18 Claims, 6 Drawing Sheets

US 8,815,685 B2

METHODS FOR FABRICATING INTEGRATED CIRCUITS HAVING CONFINED EPITAXIAL GROWTH REGIONS

TECHNICAL FIELD

The technical field generally relates to methods for fabricating integrated circuits, and more particularly relates to methods for fabricating integrated circuits with reduced sidewall-formed defects in confined epitaxial growth.

BACKGROUND

Confined epitaxial growth is used in the fabrication of many different types of integrated circuits. For example, confined epitaxial growth is used to improve the mobility characteristics of the channel region of non-planar field effect transistors (FETs) such as FinFETs. Confined epitaxial growth is also used to impart a strain on the channel region, and hence to increase the mobility, of planar FETs. In each of these examples, as well as in other applications of confined epitaxial growth, the epitaxial growth is nucleated on a portion of monocrystalline substrate that is, at least, partially bounded by a non-crystalline confinement isolation material. A crystalline mismatch at the interface between the confinement isolation material and the growing epitaxial material can cause the formation of crystalline defects in the growing material. Such defects can reduce mobility, reduce carrier lifetime, and increase leakage in devices formed in and on the grown material.

Accordingly, it is desirable to provide methods for fabricating integrated circuits having confined epitaxial growth regions wherein the epitaxially grown material is of improved crystalline quality in comparison to prior art methods. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating integrated circuits. In accordance with one embodiment, the method includes forming a portion of a semiconductor substrate at least partially bounded by a confinement isolation material. A liner dielectric is formed overlying the confinement isolation material and is treated to passivate a surface thereof. An epitaxial layer of semiconductor material is then grown overlying the portion of semiconductor substrate In accordance with a further embodiment, the method includes providing a semiconductor substrate and forming a plurality of spaced apart semiconductor fins extending upwardly from the semiconductor substrate. A surface liner dielectric is deposited overlying the semiconductor fins. An isolation dielectric is deposited to fill the spaces between individual ones of the plurality of semiconductor fins, such that the isolation dielectric and the surface liner dielectric form confined spaces extending above the plurality of fins. The surface of the surface liner dielectric is treated to passivate the surface thereof with functional groups having a higher chemical bond energy and/or lower reactivity than functional groups on the surface of the untreated liner dielectric. A crystalline semiconductor material is epitaxially grown overlying a top portion of the semiconductor fins.

In accordance with yet another embodiment, the method includes forming a plurality of spaced apart semiconductor fins extending upwardly from a semiconductor substrate. A liner dielectric layer is conformally deposited overlying the plurality of semiconductor fins, and an isolation oxide is deposited overlying the liner dielectric layer. A top surface of the plurality of semiconductor fins and a portion of the liner dielectric layer are exposed, and the exposed surface of the portion of the liner dielectric layer is silylated with a silane coupling agent. A crystalline material is epitaxially grown overlying the exposed top surface of the plurality of semiconductor fins, and the isolation oxide and the liner dielectric layer are etched to expose a side portion of the epitaxially grown material.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any expressed or implied theory presented in the preceding technical field, background, brief summary or the following detailed description.

Confined epitaxial growth finds application in the fabrication of various semiconductor integrated circuits (ICs). For example, confined epitaxial growth can be used in the fabrication of FinFETs in which the epitaxial material is grown on the top of semiconductor fins to provide a desired material for the channel of the FinFET as well as for the source and drain regions. The epitaxially grown material can be either the same as the underlying semiconductor substrate, or can be different material as required to provide the desired mobility or other characteristic needed for the IC being fabricated. For example, if the semiconductor substrate is substantially pure silicon, the epitaxially grown material can be silicon, silicon germanium (SiGe), germanium, or various group III-V or II-VI semiconductor materials. Confined epitaxial growth is also useful in planar devices such as for imparting a strain on the channel of a field effect transistor to increase the mobility of majority carriers in the channel. In such an application the confined epitaxial growth takes place in a trench etched into the semiconductor substrate that is generally bounded on one side by the substrate and on the other side by an isolation region such as a shallow trench isolation region.

Figure 1:
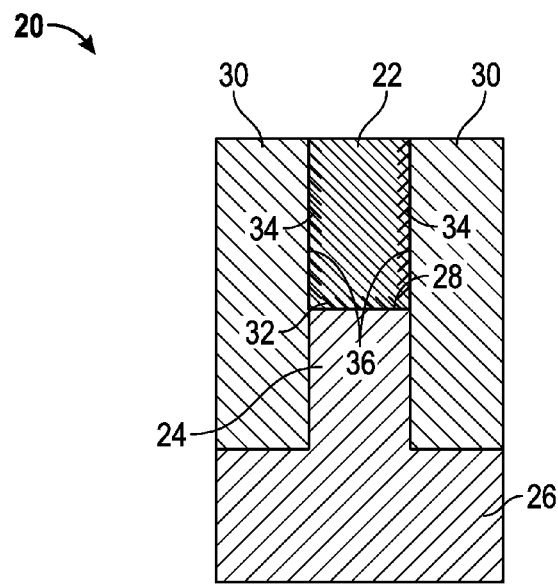
FIG. 1 schematically illustrates problems encountered in fabricating integrated circuits with conventional confined epitaxial growth.

Regardless of the application, it is important that the epitaxially grown material be of the highest quality possible. Dislocations and other defects in the grown material decrease carrier mobility and lifetime, increase leakage, reduce reliability, and otherwise adversely affect the quality of the IC being fabricated. FIG. 1 depicts, in cross section, a portion of a FinFET IC 20 after the confined epitaxial growth of a semiconductor region 22, and illustrates some of the problems encountered when confined epitaxial growth is carried out in a conventional manner. Although a FinFET IC may include a large number of fins, only a single fin 24, extending upwardly from a substrate 26, is illustrated. Fin 24 can be, for example, 7-20 nanometers (nm) in width and 20-200 nm in height, depending on the device application. Semiconductor region 22 is epitaxially grown on the top surface 28 of fin 24 and is bounded by an isolation dielectric such as isolation oxide 30. Crystalline defects in the epitaxially grown material can occur at two places in semiconductor region 22. The first place is at the interface between the top surface of the fin and the growing semiconductor region as indicated by cross hatching 32. Defects originating at the interface with the top surface of fin 24 can occur because of contamination on surface 28 or because of a lattice mismatch between the crystalline structure of the fin material and the crystalline structure of the epitaxial material. Such defects are especially common when the fin and the grown material are dissimilar materials such as, for example, a silicon fin and a silicon germanium (SiGe) epitaxial material. The second place that defects in the epitaxially grown material occur is at the interface between the growing material and the confining isolation oxide as indicated by cross hatching 34. These defects occur because, in addition to "bottom up" epitaxial growth that is nucleated at surface 28 of fin 24, growth is also nucleated randomly at the side wall surfaces 36 of the isolation oxide. Rather than producing a highly oriented and substantially monocrystalline semiconductor region, the growth nucleated at the interface with the confining isolation oxide contains a high density of dislocations and other crystalline defects and may even be polycrystalline. In the absence of the sidewall generated defects, the defects originating at the surface of fin 24 are localized near the surface and do not significantly affect the quality and performance of IC 20. Defects originating at the surface of fin 24 are well known in the art, and the method of their formation is referred to as ART (aspect ratio trapping). If the grown material is sufficiently wide, high quality material below the critical thickness for defects to form by energetic arguments of lattice mismatch can be grown, and the material quality can be transferred in the vertical direction. As long as the width to height ration is sufficient there will be no defects 32 within the top portion of the fin. Defects originating along the sidewalls, however, propagate throughout semiconductor region 22 and can severely impact IC performance. The problem with such defects is particularly acute when the grown material has a high aspect ratio. The high aspect ratio allows for trapping of the defects as they propagate through the epitaxial material.

FIGS. 2-11 illustrate methods, in accordance with various embodiments, for fabricating semiconductor integrated circuits that include a region of confined epitaxially grown material that reduce the nucleation of growth at the sidewalls of the confining dielectric. The resulting epitaxially grown material is of higher quality than the material grown by conventional methods. The various embodiments are described in the context of the fabrication of a FinFET IC, but the concepts illustrated are applicable to the fabrication of any IC that includes the growth of confined epitaxial material.

Figure 2:
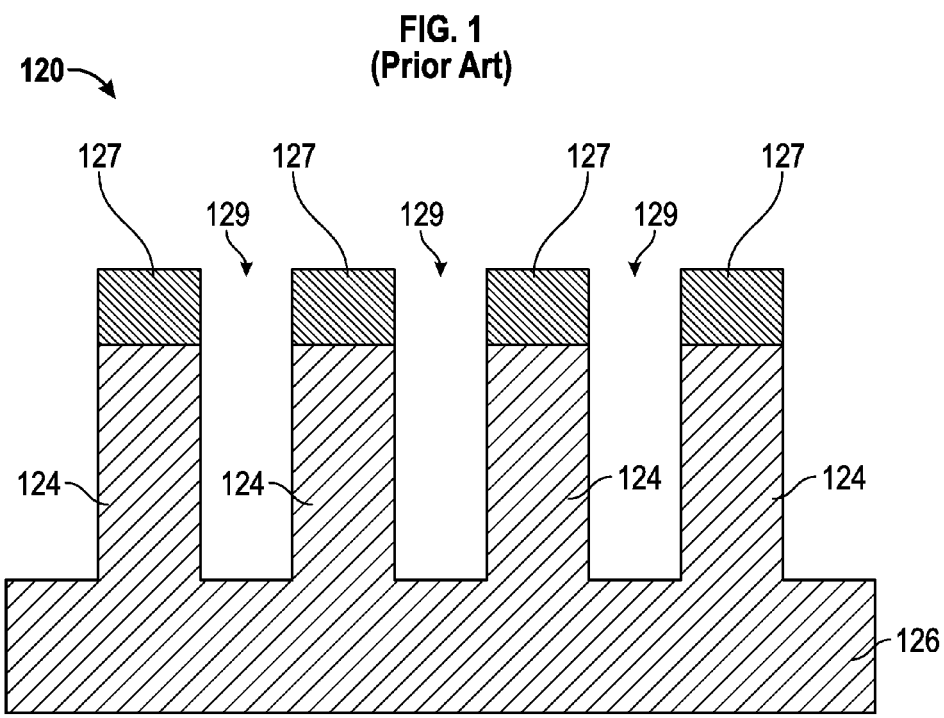
FIGS. 2-11 schematically illustrate, in cross section, method steps for the fabrication of semiconductor integrated circuits including confined epitaxial growth in accordance with various embodiments.

FIG. 2 illustrates, in a cross-sectional view, a portion of a FinFET IC 120 at an early stage of fabrication. In accordance with an embodiment, a plurality of semiconductor fins 124 is formed extending upwardly from a semiconductor substrate 126. Semiconductor substrate 126 can be, for example, monocrystalline silicon, silicon admixed with germanium, silicon admixed with conductivity-determining elements such as arsenic or boron, or other semiconductor materials commonly used in the fabrication of ICs. Semiconductor substrate 126 can be either a bulk semiconductor substrate or a semiconductor on insulator (SOI) substrate. The fins can be formed, for example, by forming a patterned hard mask 127 overlying the surface of the semiconductor substrate. The hard mask is used as an etch mask and trenches 129 are etched into the substrate by reactive ion etching (RIE) or other anisotropic etch technique to leave fins 124 spaced apart by trenches 129. The hard mask can be formed of, for example, silicon nitride, silicon oxide, silicon oxynitride, SiOCN, organic resist, amorphous carbon, amorphous silicon, or the like, that is patterned by standard photolithography and etch techniques, sidewall image transfer (SIT), or other conventional patterning techniques. As non-limiting examples, the fins can have a height of about 20-200 nm, a width of about 7-20 nm, and a pitch of about 16-50 nm. Hard mask 127 can have a thickness of about 10-60 nm, depending on the composition of the hard mask material and the depth of the trenches.

Figure 3:
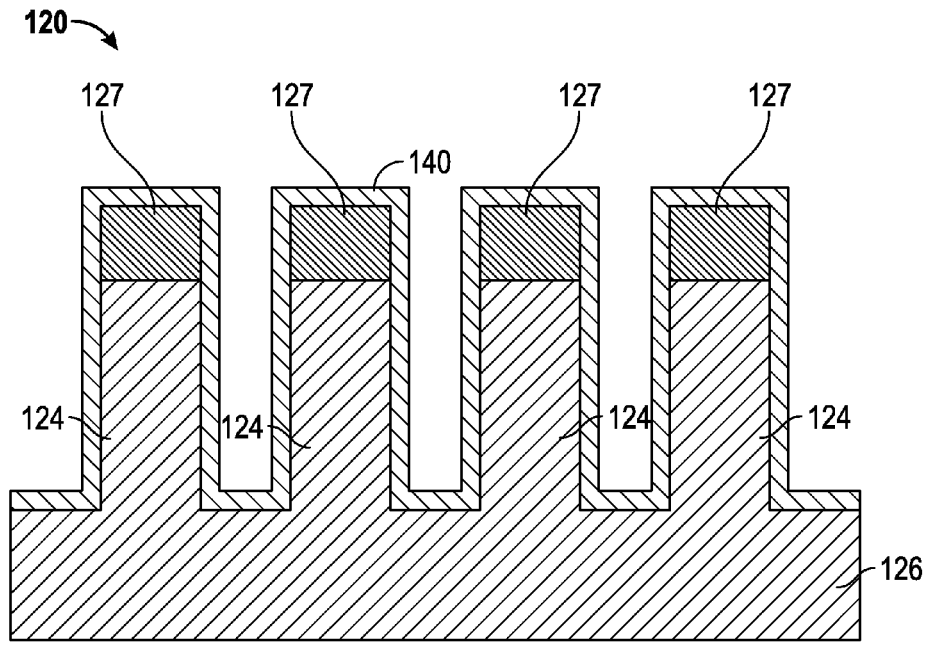

The method for fabricating IC 120 continues, in accordance with one embodiment, as illustrated in FIG. 3. A surface passivation liner dielectric 140 is conformally deposited overlying semiconductor fins 124 and the exposed portion of semiconductor substrate 126. Liner dielectric 140 can be deposited, for example, by atomic layer deposition (ALD) to a thickness in the range of about 3-5 nm. Liner dielectric 140 can be formed, for example, of a silicon oxide or a silicon nitride or other non-conducting material that it is not substantially eroded when hard mask 127 is subsequently removed.

Figure 4:
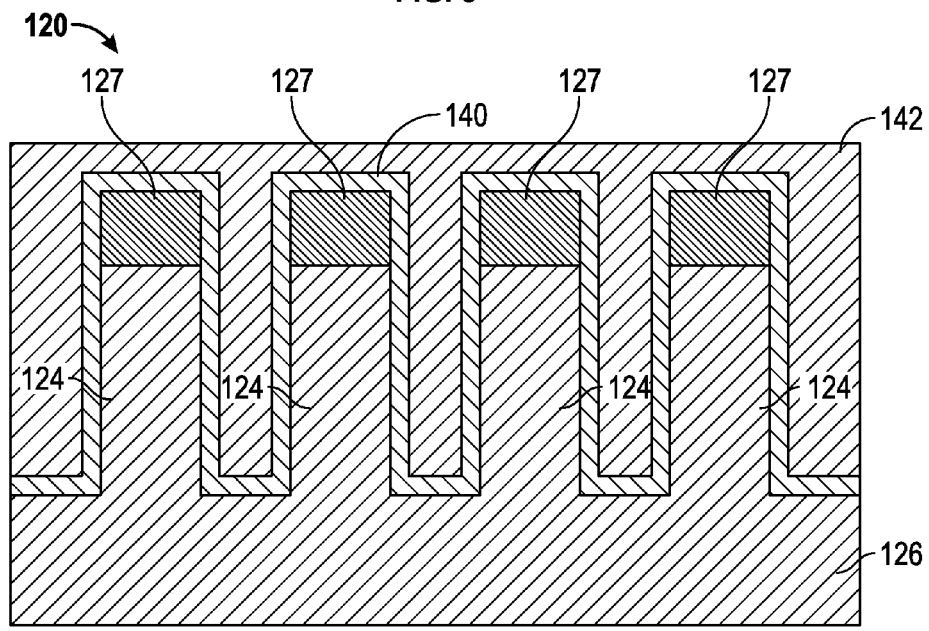

As illustrated in FIG. 4, in accordance with an embodiment, the method for fabricating IC 120 continues by depositing a layer of isolation dielectric 142 overlying liner dielectric 140 and filling the trenches between fins 124. Isolation dielectric 142 is selected based on the needs of the IC being fabricated, but is generally a low dielectric constant (low-k) oxide that provides low leakage isolation and is resistant to wet etching that may occur in subsequent processing. For convenience and to avoid confusion, isolation dielectric 142 will hereinafter be referred to as an isolation oxide. The material selected for isolation oxide 142 is generally different than the material selected for liner dielectric 140. In this manner each material can be optimized for its intended purpose: the liner material is selected to aid in providing a passivated surface for the confined epitaxial growth as is explained more fully below, and the isolation oxide is selected to provide the required electrical isolation between fins and unaffiliated circuit elements. Liner dielectric 140 is a thin layer so that it has a negligible effect on the electrical isolation provided by isolation oxide 142.

Figure 5:
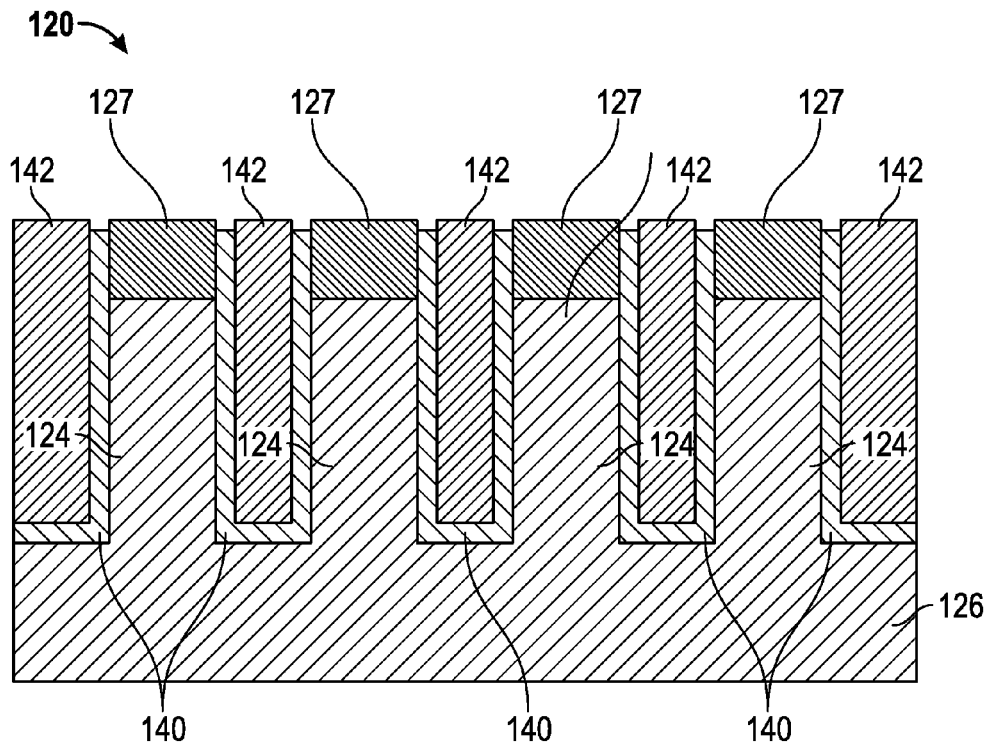

As illustrated in FIG. 5, the isolation oxide 142 and liner dielectric 140 overlying patterned hard mask 127 are removed to expose the hard mask material. The isolation oxide and liner dielectric can be removed, for example, by chemical mechanical planarization (CMP), RIE, or a combination of CMP and RIE. In accordance with one embodiment, the liner dielectric is recessed enough to expose the hard mask so that it can be subsequently removed.

Figure 6:
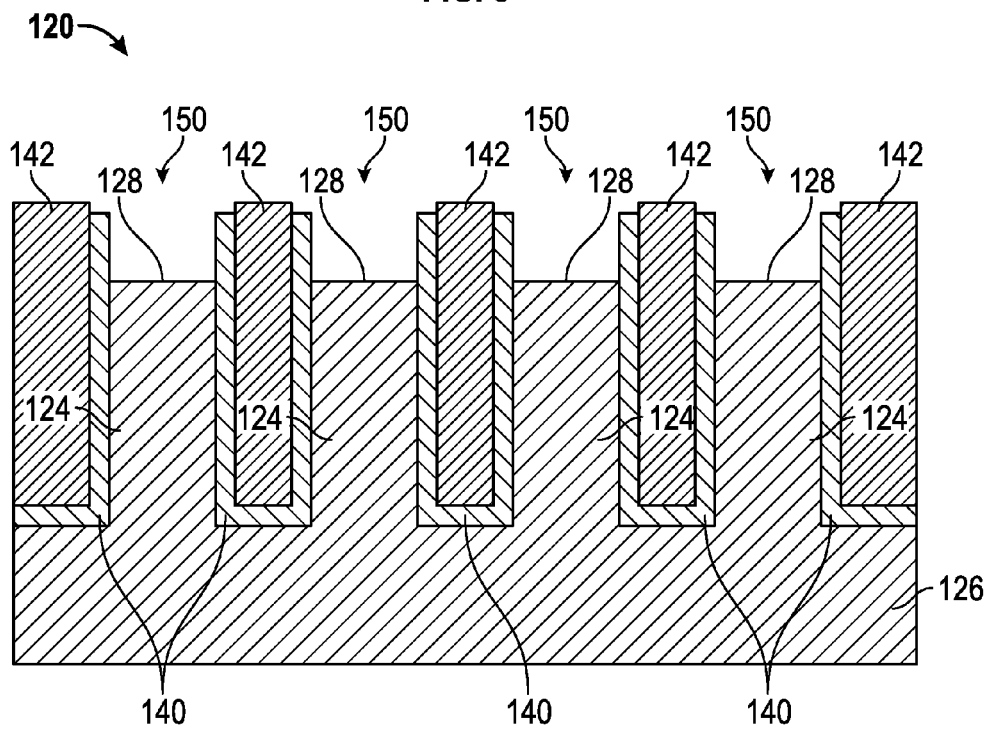

Hard mask 127 is removed as illustrated in FIG. 6 to expose the top surface 128 of fins 124. The isolation oxide and the liner dielectric form a confined space 150 extending above top surface 128. In accordance with an embodiment, if needed for the design of the IC being fabricated, the top portion of fins 124 can be etched to lower top surface 128 and to increase the depth of confined space 150 as illustrated in FIG. 7.

Figure 7:
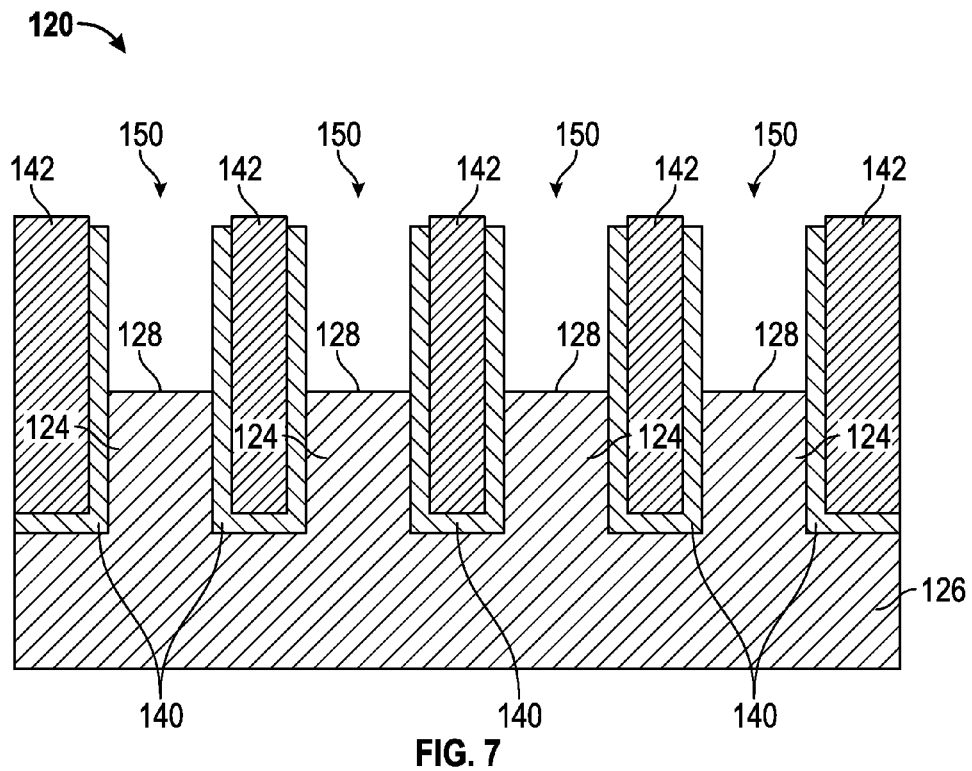

The objective of the various embodiments describe herein is to grow a region of high crystalline quality confined epitaxial semiconductor material overlying top surface 128 and substantially filling confined space 150 as illustrated in either of FIG. 6 or 7. The confined epitaxial semiconductor material can be, for example, silicon, silicon germanium, group III-V or II-VI semiconductor materials, or any other semiconductor material needed to implement the IC being fabricated. The confining material, whether isolation oxide 142 alone or in combination with liner dielectric 140 is characterized, at its surface, by highly reactive functional groups. These highly reactive functional groups, typically hydroxyl (—OH) groups result from adsorption of moisture onto the confining surface or to the confining material itself. In the absence of any treatment of the surface of the confining material, the highly reactive functional groups act as nucleation sites for reactants in the epitaxial growth environment. Multiple reactant nucleation sites result in uncontrolled growth of the semiconductor material initiated at random sites rather than ordered growth that mimics the crystalline orientation of the host semiconductor material at surface 128 of fin 124. In accordance with one embodiment, the surface of the confining material is treated to replace the highly reactive functional groups with strongly terminated functional groups having a higher chemical bond energy than the highly reactive functional groups.

Figure 8:
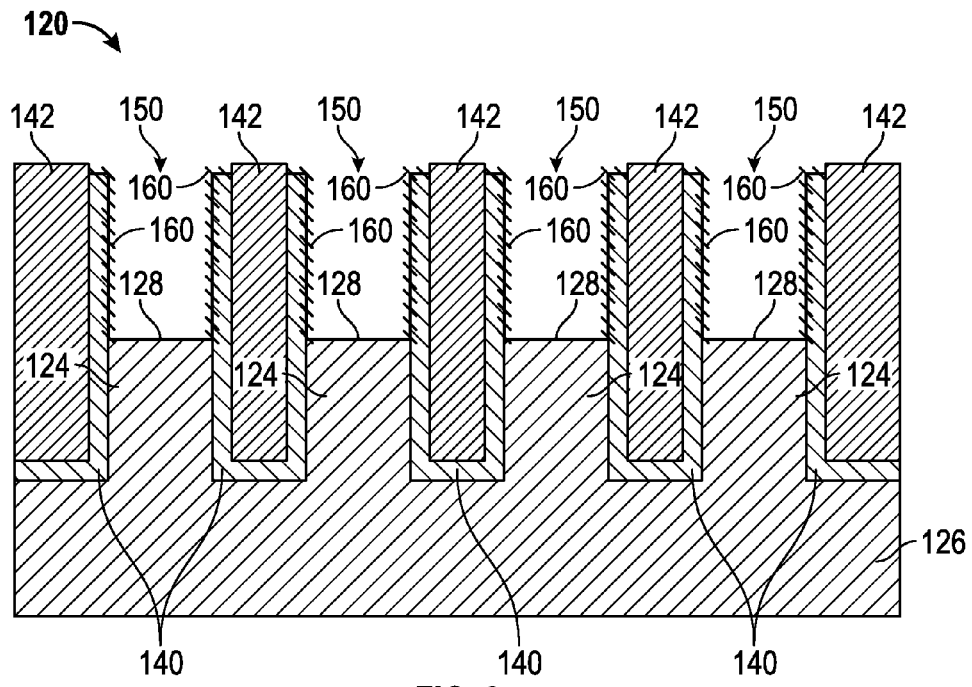

As illustrated in FIG. 8, the surface of the liner dielectric is treated to reduce the number of highly reactive functional groups and to thereby passivate the surface of the liner dielectric. For convenience of discussion such highly reactive functional groups will hereinafter be referred to as —OH groups and the illustrations will relate to the passivation of such groups. In accordance with one embodiment, the liner dielectric surface is treated to replace the reactive —OH groups with a hydrogen or nitrogen-terminated surface. Such treatment can include, for example, a plasma or thermal treatment in an ammonia ambient. FIG. 8 illustrates a chemical treatment as applied to the structure illustrated in FIG. 7, but the same treatment could also be applied to the structure illustrated in FIG. 6. In accordance with one embodiment, the chemical treatment consists of applying a passivating agent, as indicated at 160, to the surface of the liner dielectric to substitute passive sites on the surface of the passivating agent for reactive sites on the surface of the liner dielectric. The passivating agent can be, for example, a silane coupling agent. Reaction of a silane coupling agent with a surface having hydroxyl groups thereon results in a substitution reaction at the surface and the formation of a silylated surface on which the silicon atoms in the silane coupling agent are covalently attached to the surface of the liner dielectric by an oxygen linkage. A simple silane coupling agent that serves to illustrate, in a non-limiting manner, the process of passivating the surface of the confining material consists of a single silicon atom bonded to a reactive functionality (one or more) such as a chlorine atom and to R groups. The R groups can be, for example, $(CH_2)_xCH_3$, $CH_3$, $NH_2$, SH, alkoxy groups, or molecules containing arsenic, fluorine, antimony, boron, germanium, chlorine, or nitrogen atoms. The chlorine atom reacts with the SiOH on the liner dielectric surface to form a Si—O—Si bond with the R groups attached. Instead of the reactive functionality being a chlorine atom, the bonding agent can be, for example, a fluorine atom, $NH_2$, or an alkoxy group. Treating the surface of the liner dielectric in this manner results in the liner dielectric terminating at the sidewalls with functional groups that change the surface bond energy relative to the bond energy of the untreated liner dielectric. In accordance with one embodiment, treating the surface of the liner dielectric in this manner results in the liner dielectric terminating at the sidewalls with functional groups having a strongly terminated, high chemical bond energy; that is, a higher chemical bond energy than the surface of the untreated liner dielectric. In accordance with one embodiment, the passivating agent is chosen such that the surface of the liner dielectric is terminated with carbon, sulfur, nitrogen, or hydrogen bonds rather than the —OH bonds of the untreated liner dielectric. A large number of silane coupling agents such as, for example, hexamethyldisilazane can be chosen as the passivating agent. The silane coupling agent can be applied to the surface of the liner dielectric by wet chemistry, vapor phase chemistry, or plasma chemistry. In accordance with a further embodiment, other surface treatments can be conducted in place of or in addition to the silylation described. For example, a Gas Cluster Ion Beam (GCIB) can be used to treat the surface with a number of different ionized molecules such as $NF_3$, $N_2$/Ar, $CH_4$, $SiH_4$, $CH_3SiH_3$, $CHF_3$, $CO_2$, $B_2H_6$, $BH_4$, TMB, $Cl_2$, HCl, or $GeH_4$ to functionalize the surface.

Figure 9:
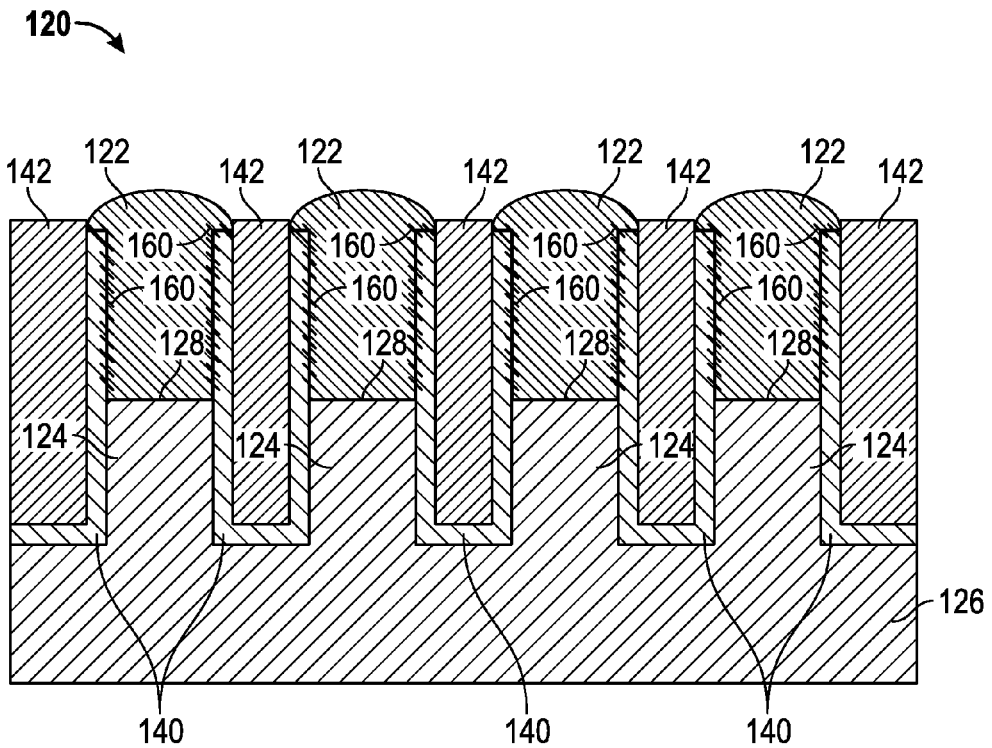

Following the passivation of the surface of liner dielectric 140, a layer of crystalline semiconductor material 122 is epitaxially grown over fins 124 to fill trenches 150 as illustrated in FIG. 9. The layer of crystalline semiconductor material can be the same semiconductor material as the fins, but it can be also be a different material forming a heterojunction at surface 128. For example, if the fins are silicon, the layer of crystalline semiconductor material can be silicon, silicon germanium, germanium, or group III-V or II-VI semiconductor materials. The layer of crystalline semiconductor material can be grown using standard selective epitaxial growth techniques. The reactants, growth temperature, and growth pressure can be selected to result in the selective growth. For example, if the layer of crystalline semiconductor material is silicon germanium, the layer can be grown using reactants including dichlorosilane ($SiCl_2H_2$) and germane ($GeH_4$) in a hydrogen carrier gas. Because the surface of liner dielectric 140 has been passivated in the manner described above, growth of a high crystalline quality semiconductor layer 122 proceeds in a "bottom up" manner nucleated on surface 128 with little or no nucleation on the sidewalls of the liner dielectric. Si or Ge atoms in the reactant ambient diffuse along the passivated liner dielectric surface without growth being nucleated on that surface.

Figure 10:
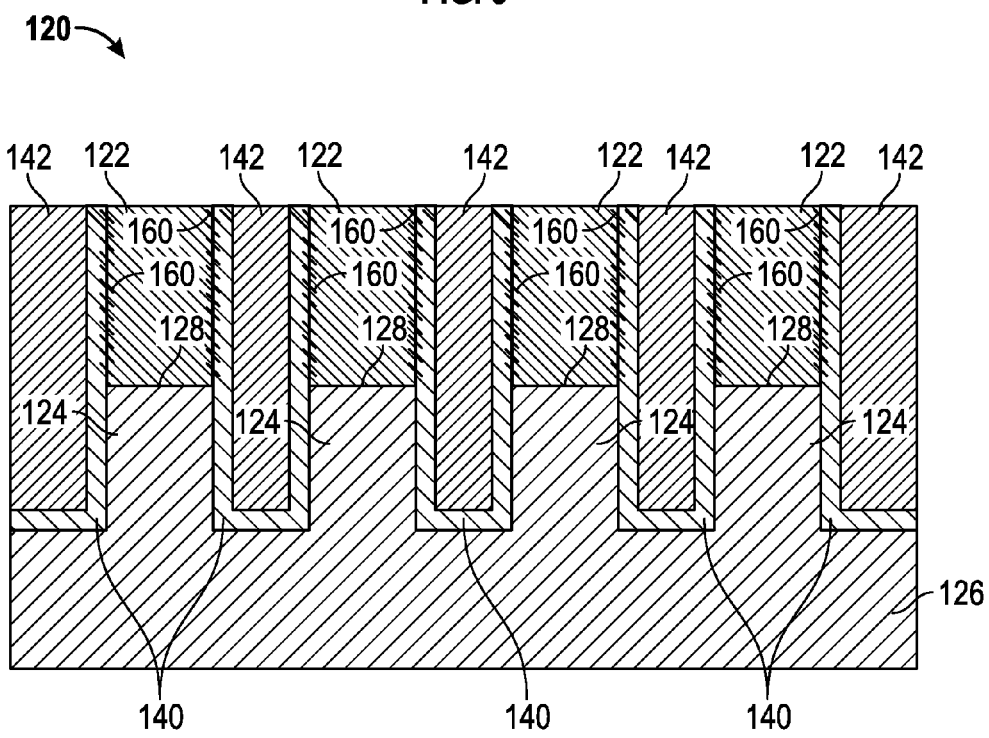
Figure 11:
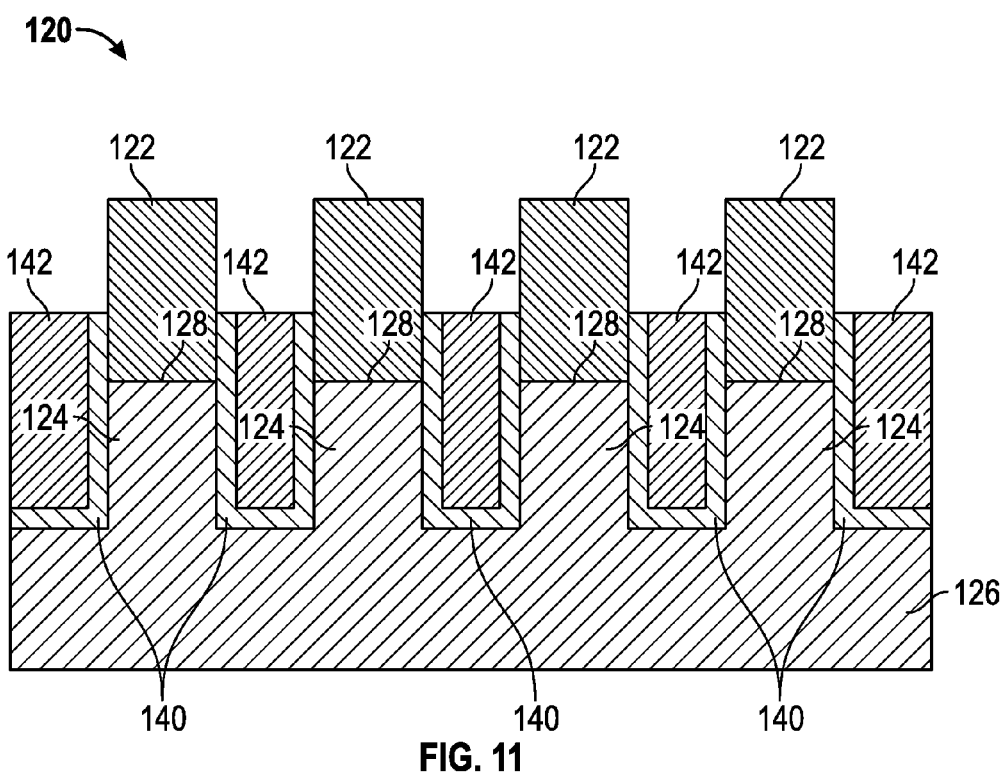

As illustrated in FIGS. 10 and 11, the method for fabricating IC 120 continues, in accordance with an embodiment, by planarizing the structure of FIG. 9 to remove any excess epitaxial semiconductor material. The structure can be planarized, for example by CMP. After planarization, isolation oxide 142 and liner dielectric 140 are recessed to expose a side portion of epitaxial semiconductor material 122. Isolation oxide 142 and liner dielectric 140 can be recessed by etching in either a single etching step or in separate etching steps, depending on the composition of the oxide and the liner. The fabrication of semiconductor IC can then proceed in conventional manner with the formation of gate insulator, gate electrode, source and drain regions, and the like.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
   forming a region of a first semiconductor material at least partially bounded by a confinement isolation material to provide a trench;

providing a liner dielectric overlying the confinement isolation material in the trench;

treating the liner dielectric to passivate a surface thereof with functional groups having a higher chemical bond energy and/or lower reactivity than the functional groups of the surface of the untreated liner dielectric; and growing an epitaxial layer of a second semiconductor material overlying the region of first semiconductor material and filling the trench, wherein growth of the epitaxial layer is nucleated on the surface of the first semiconductor material with little or no nucleation on the liner dielectric due to passivation of the surface of the liner dielectric.

2. The method of claim 1 wherein treating comprises exchanging terminal functional groups at the surface of the liner dielectric.

3. The method of claim 1 wherein treating comprises applying a passivating agent to the surface of the liner.

4. The method of claim 1 wherein treating comprises applying a silane coupling agent to the surface of the liner dielectric.

5. The method of claim 1 wherein treating comprises silylation of the surface of the liner dielectric.

6. The method of claim 1 wherein treating comprises applying a silane coupling agent to the surface of the liner dielectric to change the surface of the liner dielectric from a surface terminating in —OH functional groups to a surface terminating in groups comprising N, H, As, Sb, B, Cl, NH, SH, Ge, $CH_2$, or $CH_3$.

7. The method of claim 1 wherein treating comprises applying hexamethyldisilazane to the surface of the liner dielectric.

8. A method for fabricating a semiconductor integrated circuit comprising:

providing a semiconductor substrate;

forming a plurality of spaced apart semiconductor fins extending upwardly from the semiconductor substrate;

depositing a surface liner dielectric overlying the semiconductor fins;

depositing an isolation dielectric to fill the spaces between individual ones of the plurality of semiconductor fins, the isolation dielectric and the surface liner dielectric forming confined spaces extending above the plurality of fins;

treating the surface of the surface liner dielectric to passivate the surface thereof with functional groups having a higher chemical bond energy and/or lower reactivity than the functional groups of the surface of the untreated liner dielectric; and epitaxially growing a crystalline semiconductor material overlying a top portion of the semiconductor fins and filling the confined spaces, wherein growth of the crystalline semiconductor layer is nucleated on the surface of the semiconductor fins with little or no nucleation on the surface liner dielectric due to passivation of the surface of the liner dielectric.

9. The method of claim 8 wherein treating comprises applying hexamethyldisilazane to the surface of the surface liner dielectric.

10. The method of claim 8 wherein treating comprises changing chemical bonds at the surface of the surface liner dielectric to bonds having a stronger bonding energy to reduce reaction of surface bonds with semiconductor source materials during the epitaxial growth.

11. The method of claim 8 wherein treating comprises changing chemical bonds at the surface of the surface liner dielectric to bonds having a different bonding surface energy to reduce reaction of surface bonds with semiconductor source materials during the epitaxial growth.

12. The method of claim 8 wherein treating comprises passivating the surface with gas cluster ion beam treatment.

13. The method of claim 12 wherein treating comprises using a gas cluster ion beam to treat the surface of the surface liner dielectric with an ionized molecule chosen from $NF_3$, $N_2/Ar$, $CH_4$, $SiH_4$, $CH_3SiH_3$, $CHF_3$, $BH_4$, $B_2H_6$, $Cl_2$, $HCl$, TMB, $CO_2$, or $GeH_4$.

14. The method of claim 8 wherein treating comprises reacting a silane coupling agent with the surface of the surface liner dielectric to cause the surface to be terminated with C, N, or H bonds rather than —OH bonds.

15. A method for fabricating a semiconductor integrated circuit comprising:

forming a plurality of spaced apart semiconductor fins extending upwardly from a semiconductor substrate;

conformally depositing a liner dielectric layer overlying the plurality of semiconductor fins;

depositing an isolation oxide overlying the liner dielectric layer;

exposing a top surface of the plurality of semiconductor fins and a portion of the liner dielectric layer to form confined spaces extending above the plurality of fins;

silylating the exposed surface of the portion of the liner dielectric layer with a silane coupling agent;

epitaxially growing a crystalline material overlying the exposed top surface of the plurality of semiconductor fins and filling the confined spaces, wherein growth of the crystalline material is nucleated on the top surface of the semiconductor fins with little or no nucleation on the liner dielectric layer due to silylation of the exposed surface of the liner dielectric layer; and etching the isolation oxide and the liner dielectric layer to expose a side portion of the epitaxially grown crystalline material.

16. The method of claim 15 wherein silylating the exposed surface comprises applying a silane coupling agent selected to change surface energy of the exposed surface relative to the surface energy of the untreated exposed surface.

17. The method of claim 15 wherein silylating the exposed surface comprises applying hexamethyldisilazane to the surface of the portion of the liner dielectric layer.

18. The method of claim 15 wherein silylating the exposed surface comprises applying the silane coupling agent by a process chosen from wet chemistry, vapor phase chemistry, or plasma chemistry.

* * * * *